United States Patent
Boettcher

(10) Patent No.: US 8,791,697 B2
(45) Date of Patent: Jul. 29, 2014

(54) METHOD AND MAGNETIC RESONANCE SYSTEM FOR MR SPECTROSCOPY

(75) Inventor: Uwe Boettcher, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 461 days.

(21) Appl. No.: 13/173,285

(22) Filed: Jun. 30, 2011

(65) Prior Publication Data

US 2012/0001634 A1    Jan. 5, 2012

(30) Foreign Application Priority Data

Jul. 2, 2010   (DE) .................. 10 2010 025 886

(51) Int. Cl.
*G01V 3/00*   (2006.01)

(52) U.S. Cl.
USPC ........................................ 324/307; 324/309

(58) Field of Classification Search
USPC ................... 324/307, 309, 314, 300
See application file for complete search history.

(56) References Cited

U.S. PATENT DOCUMENTS

| | | | |
|---|---|---|---|
| 4,506,223 A * | 3/1985 | Bottomley et al. | 324/309 |
| 5,111,143 A * | 5/1992 | McKinnon et al. | 324/307 |
| 5,233,301 A * | 8/1993 | Meyer et al. | 324/309 |
| 6,320,381 B1 | 11/2001 | Hennig | |

OTHER PUBLICATIONS

"MR-Spektroskopie Benutzerhandbuch, Version syngo MR 2002B," Siemens AG (2002).
"In Vivo NMR Spectroscopy—2nd Edition, Principles and Techniques," De Graaf (2007), p. 352.

* cited by examiner

*Primary Examiner* — Louis Arana
(74) *Attorney, Agent, or Firm* — Schiff Hardin LLP

(57) ABSTRACT

A method for MR spectroscopy includes the steps of (a) switching at least one phase coding gradient for spatial coding of a spectral information to be detected, and (b) detection of the spectral information, and repeating (a) and (b) until a predetermined raw data space has been scanned. Specific spectral information is detected in (b) when the at least one phase coding gradient respectively has a value of 0. This specific spectral information is evaluated in order to determine a property of the spectral information already detected in (b), or still to be detected in (b).

10 Claims, 6 Drawing Sheets

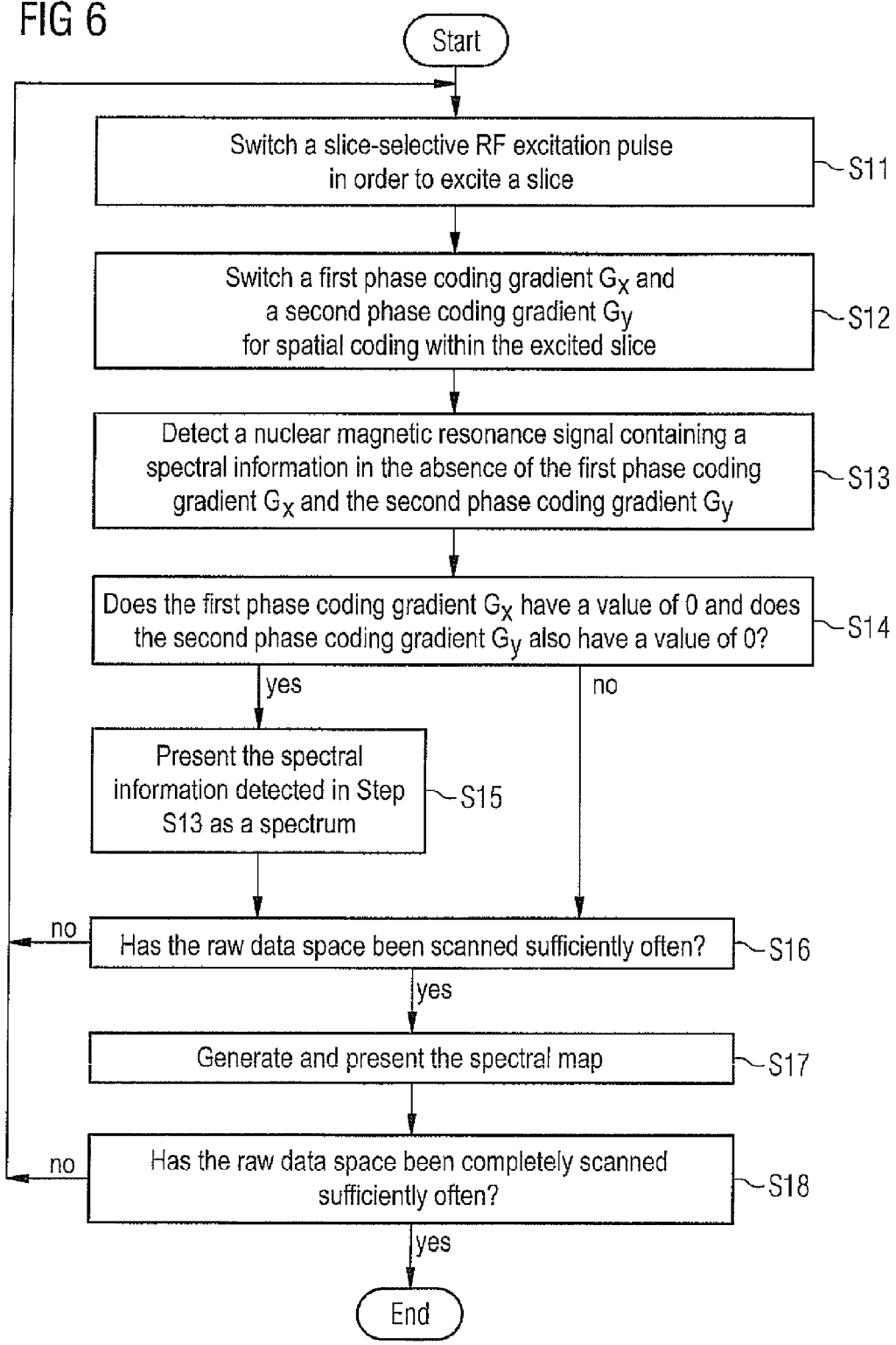

METHOD AND MAGNETIC RESONANCE SYSTEM FOR MR SPECTROSCOPY

BACKGROUND OF THE INVENTION

1. Field of the Invention

The present invention concerns a method for MR spectroscopy of the type operating with "Chemical Shift Imaging" (CSI) measurements, as well as a correspondingly designed magnetic resonance system.

2. Description of the Prior Art

CSI measurements in MR spectroscopy normally have a long measurement duration and thus occupy a considerable time duration for a complete patient examination. Moreover, the results of CSI measurements can be markedly negatively influenced by movements of the corresponding volume segment or of the organ to be examined, such that monitoring of the quality of the CSI measurements during the data acquisition is advantageous. Such a quality control detects the following information about the CSI measurements:

the homogeneity of the magnetic field in the measurement volume,
the signal-to-noise ratio in the acquired measurement data, and
the signal contributions of unwanted signals.

SUMMARY OF THE INVENTION

An object of the present invention is to improve the quality control in CSI measurements.

This object is achieved in accordance with the present invention by a method for MR spectroscopy that includes the following steps:

Step a:
Switching one or more phase coding gradients in order to therefore produce a spatial coding of a spectral information to be detected.

Step b:
Detect the spectral information or scan measurement signals in order to thereby detect the spectral information.

If the one phase coding gradient has a value of 0 in Step a) or the multiple phase coding gradients respectively have a value of 0, in the following Step b) the spectral information is additionally evaluated separately in order—starting from this spectral information—to determine a quality property of the method according to the invention, i.e. a quality property of the already detected spectral information or of the spectral information that is still to be detected.

In contrast to single voxel MR spectroscopy or a single volume technique in which only one voxel is excited and the spectrum is then determined, in CSI measurements measurement steps are repeated with respectively different phase coding gradient combinations until the raw data space has been scanned, before the spectrum for specific regions of the volume segment of interest (ROI, "Region of Interest") can be created by a multidimensional Fourier transformation from the spectral information detected in the repeatedly implemented Step b), this spectrum corresponding via the Fourier transformation with raw data space. In order to check the quality of the CSI measurements using the spectra created by the CSI measurements, according to the prior art it would be necessary to wait through the entirety of the CSI measurements. In contrast, according to the invention the spectral information that is detected if the center of the raw data space (k-space) is scanned without a phase coding gradient (i.e. the phase coding gradient or phase coding gradients respectively have a value of 0) enters not only into the spectra that exist after the multidimensional Fourier transformation, but also is evaluated on its own in order to already obtain a conclusion about the quality of the CSI measurements at an early stage.

According to the invention, the evaluation of the spectral information that is detected when the center of the raw data space is scanned without a phase coding gradient also takes place automatically. A reaction to this automatic evaluation—for example a termination of the current CSI measurements—can also be implemented automatically.

This specific spectral information that is detected if the phase coding gradient or gradients respectively have a value of 0 is represented as a spectrum and/or time signal (i.e. as a measurement signal in the time range).

Using this spectrum, an experienced user can assess whether the quality of the previously detected spectral information or of the spectral information that is still to be detected lies within an expected region.

The generation of a spectrum starting from a spectral information that is detected in Step b)—wherein at least one phase coding gradient is activated in Step a) (i.e. a value≠0)—is not meaningful since the phase coding affects the measurement signal, or the spectral information detected in Step b), in such a way that an assessment using a spectrum generated starting only from this spectral information is not possible.

Starting from the spectrum that is generated from this specific spectral information without a phase coding gradient, a quality property of the CSI measurements can be determined using the following features:

The line width of spectral lines of this spectrum. If the CSI measurements exhibit a good quality property, the spectral lines will have only a small line width. A line width is considered to be small if a frequency bandwidth, within which the corresponding spectral line (for example of the water signal) is above an average value of the spectrum, is smaller than a predetermined threshold (for example 30 Hz).

The signal-to-noise ratio of the spectrum. If the CSI measurements have a good quality property, the signal-to-noise ratio will be above a predetermined threshold (for example 10 dB).

The presence of an unwanted spectral line within the spectrum. If the CSI measurements exhibit a good quality property, spectral lines will exist within the spectrum only at predetermined frequencies, or no spectral lines exist at predetermined frequencies. For example, in proton spectroscopy a spectrum has a poor quality (from a medical standpoint) if a spectral line corresponding to a fat signal is present at disproportional strength within the spectrum.

Using the features described above, either an experienced user (given consideration of the spectrum) or even an automated method (using the spectral information detected in Step b) can estimate the quality of the previously detected spectral information, and therefore also of the spectral information that is still to be detected.

In a preferred embodiment according to the invention, the specific spectral information without phase coding gradients is detected directly at the beginning of the CSI measurements. Depending on this spectral information detected in such a manner, the properties of the spectral information to be detected in Step b) are then deduced.

Such an individual measurement is particularly important if corresponding planning images have been acquired a longer time period before the beginning of the CSI measurements, since the planning of the CSI measurements and an implementation of adjustments have required a longer period of time, and movements could have occurred during this time period. For example, with such an individual measurement it can be checked before the beginning of the CSI measurements whether the implementation of the CSI measurements is reasonable at all, or whether additional steps are necessary in order to improve the quality of the CSI measurements to be implemented.

Before each step a), a selective excitation can be conducted by means of an RF pulse in order to limit the partial volume segment (that is detected by one or more phase coding gradients) relative to the case that is processed without selective excitation.

For example, with the selective excitation it is possible to excite only one slice, such that only two (rather than three) phase coding gradients are necessary for additional spatial coding. The selective excitation of a rod-like volume with a rectangular cross section is also possible. In this case only one phase coding gradient is still necessary for spatial coding in the longitudinal direction of the rod-like volume.

In a further embodiment according to the invention, the raw data space is scanned repeatedly, for example in order to improve the signal-to-noise ratio of the detected spectral information or of the spectra to be created. Spectra thus can be shown for multiple voxels of the volume segment (which corresponds through the Fourier transformation with the raw data space) as soon as the corresponding spectral information for generation of these spectra are present (i.e. detected and evaluated).

In other words, a spectrum is respectively generated and presented for specific voxels of the corresponding volume segment as soon as the raw data space has been scanned accordingly. For example, these spectra can be displayed if the raw data space has been sufficiently scanned the first time in order to generate these spectra. However, it is also possible to display corresponding signals and spectra if all necessary signals have been measured for an averaging, which signals are necessary for a generation of spectra calculated for the different voxels by means of averaging (accumulation). It is not absolutely necessary to detect all points of the raw data space for an averaging. For example, the possibility exists to limit the scanning of the raw data space to the middle of this raw data space.

For simplification, it is also possible to display only signals and spectra from the middle of the volume segment (which corresponds via the Fourier transformation with the raw data space).

In a further embodiment of the invention, corresponding points or voxels of the raw data space are scanned repeatedly in order to improve the signal-to-noise ratio via the corresponding averaging. When the middle of the raw data space is scanned, or a measurement takes place without phase coding gradients, the spectral information that is then detected are respectively (also) separately evaluated (for example presented as a spectrum) in order to evaluate the already-detected spectral information, or spectral information that is still to be detected with regard to its quality.

In other words, when—in the method according to the invention—the measurement (data acquisition) takes place without phase coding gradients, the user can always assess the quality properties of the method in order to possibly take corresponding measures to improve the quality. The quality control of the CSI measurements therefore takes place online (i.e. while the CSI measurements are implemented) and not just after the end of the CSI measurements, as is typical according to the prior art.

The present invention also encompasses, a magnetic resonance system for MR spectroscopy. This magnetic resonance system includes an activation unit to activate a scanner (data acquisition unit) of the magnetic resonance system, a receiver device to receive signals acquired by the scanner; and an evaluation device to evaluate the signals and to create one or more spectra. The magnetic resonance system is designed such that the to switch (activate) one or more phase coding gradients for spatial coding of spectral information to be detected and to detect the spectral information until a predetermined raw data space has been sufficiently scanned in order (for example) to generate corresponding spectra from the detected spectral information via a multidimensional Fourier transformation. When the magnetic resonance system detects specific spectral information under the condition that the phase coding gradient or gradients has (or have) a value of 0, the magnetic resonance system evaluates the specific spectral information in its evaluation device in order to determine a property of the already-detected spectral information, or a property of spectral information that is still to be detected.

The advantages of the magnetic resonance system according to the invention essentially correspond to the advantages of the method according to the invention that have been described in detail above.

Furthermore, the present invention encompasses a non-transitory computer-readable storage medium encoded with programming instructions, in particular a computer program or software, that can be loaded into a memory of a programmable controller or a computer of a magnetic resonance system. All or various embodiments of the method according to the invention that are described above can be executed by the execution of the programming instructions when the computer program runs in the controller. The computer program may possibly require peripheral program components, for example libraries and auxiliary functions, in order to realize the corresponding embodiments of the method. The software can be source code (for example C++) that must still be compiled and linked or that must only be interpreted, or an executable software code that is to be located into the corresponding computer for execution.

The computer-readable storage medium can be a DVD, a magnetic tape or a USB stick, for example, on which electronically readable control information is stored. When this control information (software) is read from the data medium and stored in a controller or computer of a magnetic resonance system, all embodiments of the method according to the invention that are described in the preceding can be implemented.

The present invention is particularly suitable for CSI measurements for proton spectroscopy in order to implement a quality control online. Naturally, the present invention is not limited to this preferred application field since the present invention can also be used in all types of MR spectroscopy (not just proton spectroscopy).

BRIEF DESCRIPTION OF THE DRAWINGS

FIG. 6 is a flow chart of a method according to the invention for MR spectroscopy.

DESCRIPTION OF THE PREFERRED EMBODIMENTS

Figure 1:
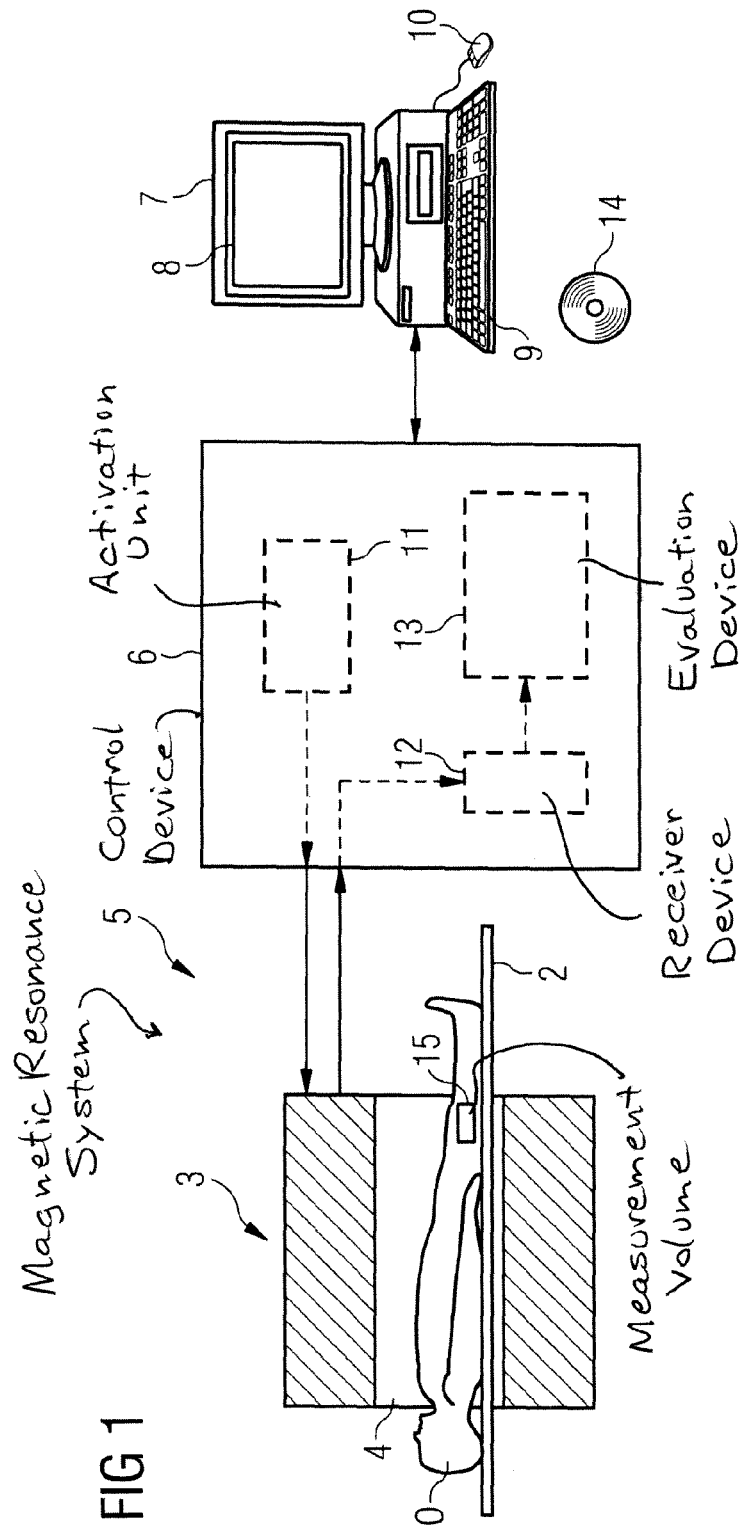
FIG. 1 schematically shows a magnetic resonance system according to the invention.

A magnetic resonance system 5 according to the invention is schematically shown in FIG. 1. The magnetic resonance system 5 includes a scanner 3 with which the magnetic fields necessary for the MR spectroscopy are generated in a measurement space, a table or board 2, a control device 6 with which the scanner 3 is operated and MR data from the scanner 3 are received, and a terminal 7 connected to the control device 6.

The control device 6 includes an activation unit 11, a receiver device 12 and an evaluation device 13. During the creation of a spectrum MR data are acquired by the receiver device 12 by means of the scanner 3, wherein the scanner 3 and the table 2 are activated by the activation unit 11 such that MR data are acquired in a measurement volume 15 that is located inside the body of a patient O situated on the table 2.

The evaluation device 13 then prepares the MR data such that they can be graphically presented as a spectrum on a monitor 8 of the terminal 7. In addition to the graphical presentation of spectra, a three-dimensional volume segment to be measured or a quasi-two-dimensional slice can, for example, be predetermined by a user with the terminal 7 (which, in addition to the monitor 8 comprises a keyboard 9 and a mouse 10), and additional parameters can be defined for the implementation of the method according to the invention. The software for the control device 6 can also be loaded into the control device 6 via the terminal 7. This software of the control device 6 embodies the method according to the invention. It is also possible for a method according to the invention to be embodied in software that runs on the terminal 7. Independent of the software in which the method according to the invention is embodied, the software can be stored on a DVD 14 so that this software can then be read from the DVD 14 by the terminal 7 and can either be copied into the control device 6 or into a computer of the terminal 7 itself.

Figure 2:
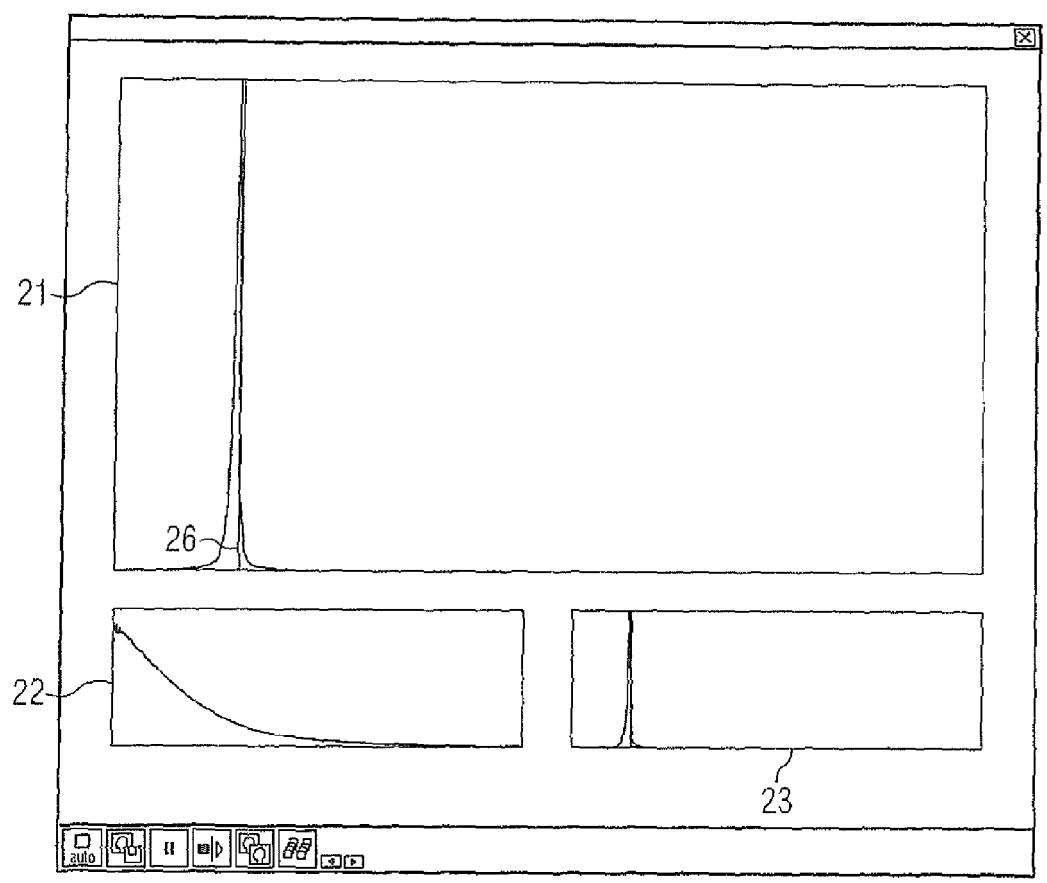
FIG. 2 shows results of a measurement according to the invention with a dominating water signal given sufficient basic field homogeneity.

Results according to the invention in a CSI measurement with a dominating water signal and sufficient shim are also shown in FIG. 2. A shim is a correction of basic field inhomogeneities that are caused in (for example) production tolerances and in ferromagnetic articles distributed in the surroundings, but are significantly generated by the patient O.

As soon as spectral information or a measurement signal is acquired without phase coding gradient (meaning that the phase coding gradients respectively have a value of 0), this measurement signal 22 is shown in a time range (thus over time) at the bottom left in FIG. 2. The spectrum 23 resulting from this measurement signal is shown to the lower right in FIG. 2. The spectrum 21 with respect to time is shown at the top in FIG. 2. In other words, the averaged spectrum 21 results from the mean of the current spectrum 23 (shown in the lower right) and the respective previous spectra 23 shown at the lower right. If the k-space center is detected during the first scan pass of k-space (raw data space), thus is detected for the first time, the averaged spectrum 12 corresponds to the current spectrum 23.

Using the averaged spectrum 21, the current spectrum 23 or the single shot spectrum 23 and the corresponding measurement signal 22 in the time period, an experienced user can draw conclusions about the quality of the CSI measurement that is presently implemented (for example conclusions about the achieved homogeneity in the measurement volume). For example, the relatively small line width of the water signal to the left in both the averaged spectrum 21 and in the single shot spectrum 23 is indicative of a good homogeneity (and therefore a good quality).

Figure 3:
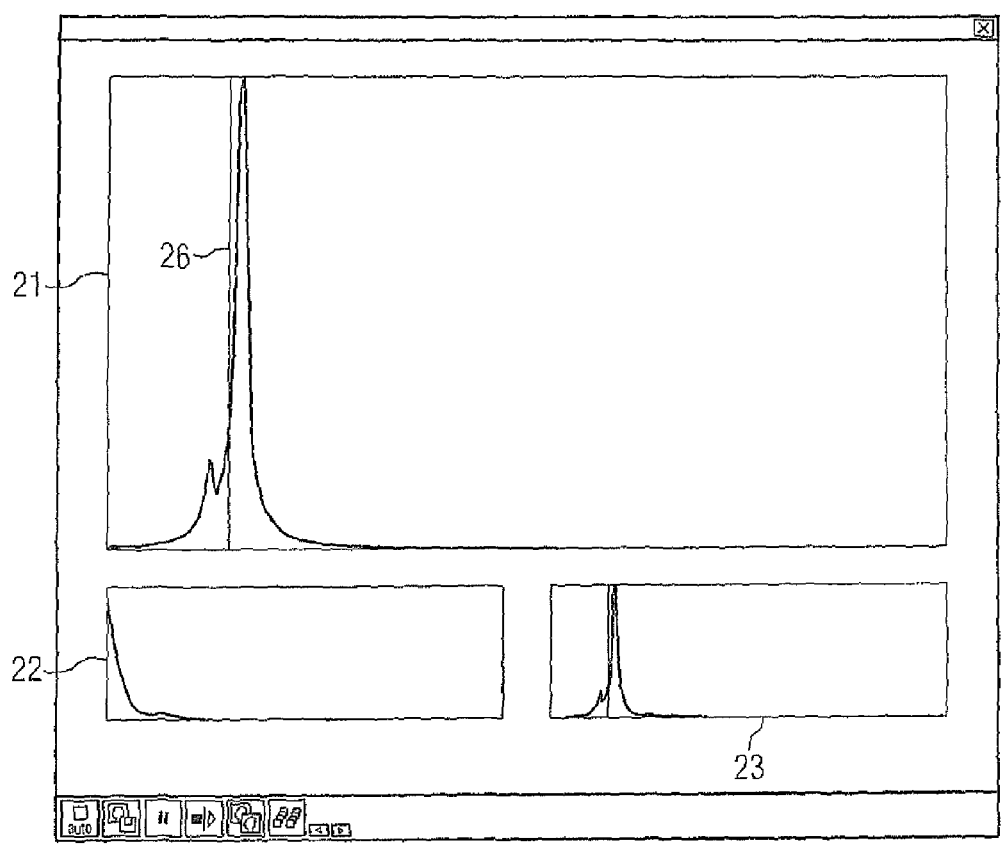
FIG. 3 shows results according to the invention of a measurement with a dominating water signal given a poor basic field homogeneity.
Figure 4:
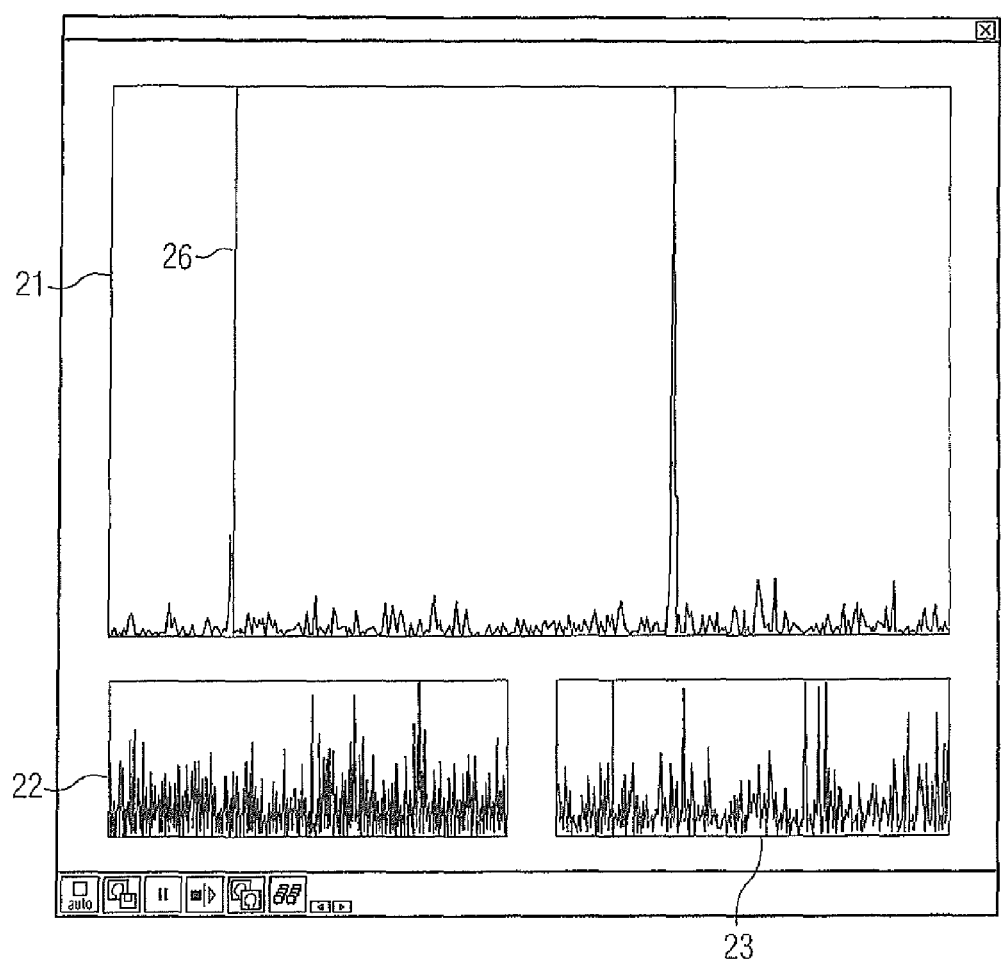
FIG. 4 shows results according to the invention with regard to a measurement in which the measurement signal is not dominated by water, and wherein the results show a poor signal-to-noise ratio.

In FIGS. 2-4 a line 26 represents the position of the system frequency, wherein at this point the water signal should be apparent. In proton spectroscopy, using the attitude of the water signal relative to the line 26 it can be monitored whether a frequency adjustment was successful.

Shown in FIG. 3 are results according to the invention of a CSI measurement, comparable to FIG. 2, with a dominant water signal but with poor (insufficient) shim. The poor quality of the CSI measurement appears in the wider (in comparison to FIG. 2) line width of the water signal and its split both in the averaged spectrum 21 and in the current spectrum 23. The faster decline of the measurement signal 22 over time in FIG. 3 in comparison to FIG. 2 is also indicative of a poor quality.

Using the results or their depictions 21-23 in FIG. 3, the poor shim state for the corresponding CSI measurement can already be established during the data acquisition (thus online). The current CSI measurement can be terminated in reaction to such an established poor shim state, and a better shim state can be sought before the CSI measurement is restarted.

Results according to the invention of a CSI measurement that are again comparable with FIG. 2 are shown in FIG. 4, wherein in this measurement the result is not dominated by water.

A poorer or smaller signal-to-noise ratio than in the results of FIGS. 2 and 3 is apparent in the results shown in FIG. 4. This poor signal-to-noise ratio can be recognized over time in the noisy curve of the measurement signal 22, for example.

Figure 5:
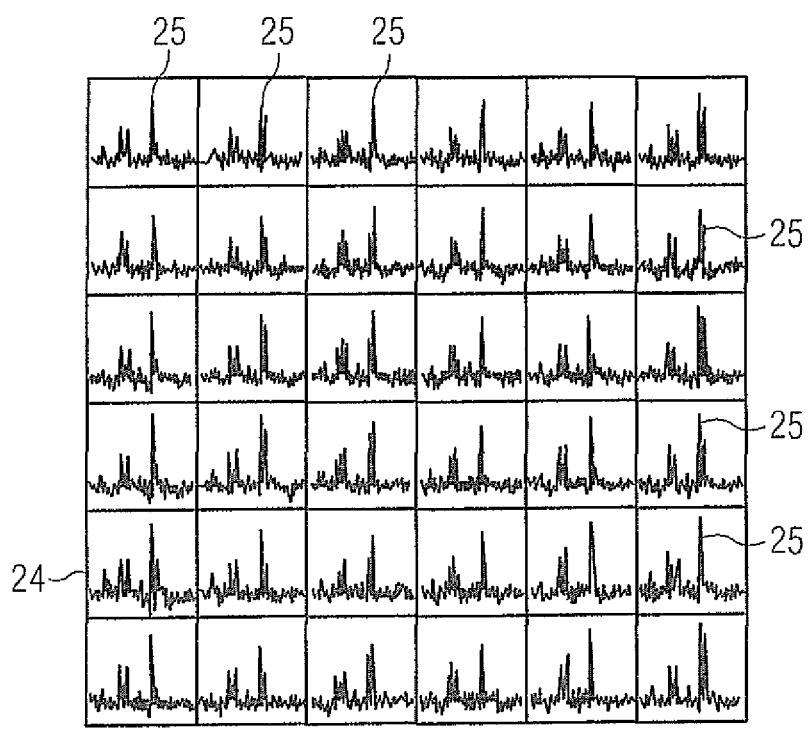
FIG. 5 is a spectral map according to the invention of spectral voxels in a CSI measurement.

A spectral map 24 according to the invention of central voxels of a CSI measurement is shown in FIG. 5. In other words, the spectral map 24 shows various spectra 25 of various voxels which are located in proximity to the center of the scanned volume segment. Since this spectral map is likewise already shown during the CSI measurement, for example after the first or second complete scan procedure of the raw data space (which corresponds via the Fourier transformation with the volume segment), the quality of the implemented CSI measurement can also be evaluated online using this spectral map 24.

A program workflow plan of a method according to the invention for MR spectroscopy is shown in FIG. 6.

In a first Step S11, a slice of the volume segment to be scanned is excited with an RF excitation pulse.

In Step S12 a first phase coding gradient $G_x$ and a second phase coding gradient $G_y$ are subsequently switched within the excited slice for spatial coding.

In the following Step S13 a measurement signal or, respectively, a nuclear magnetic resonance signal is detected, wherein the two phase coding gradients $G_x$ and $G_y$ are not switched in the detection of the nuclear magnetic resonance signal. A spectral information is also detected via this nuclear magnetic resonance signal.

In Step S14 it is checked whether the phase coding gradients $G_x$ and $G_y$ in Step S12 respectively have a value of 0, thus are essentially not present. If this is the case, the method branches to Step S15 and presents the spectral information acquired immediately preceding in Step S13 as spectrum 21, 23. Moreover, in this case the nuclear magnetic resonance signal or measurement signal 22 can also be shown over time, as it is shown in FIGS. 2 through 4. Using the spectra 21, 23 and using the measurement signal curve 22 a trained user can check the quality of the method.

After Step S15 the method comes to the query or, respectively, Step S16. In this Step S16 it is checked whether the raw data space has been scanned sufficiently often or whether additional spectral information is to be acquired according to the method according to the invention. If the raw data space has not yet been scanned sufficiently often, the method returns to Step S11. If the raw data space has been scanned sufficiently often, the method according to the invention branches to Step S17.

If at least one of the two phase coding gradients $G_x$ and $G_y$ does not have a value of 0 at the query of Step S14, the method skips Step S15 and immediately comes to the query S16 that was just described.

The decisive difference relative to the prior art is represented by Steps S14 and S15. According to the prior art, the spectral information acquired without phase coding gradient present (meaning that the phase coding gradients $G_x$ and $G_y$ have a value of 0) do not come to any particular importance in the CSI measurement. In contrast to this, the present invention is based on the insight that this spectral information can be used by itself in order to—starting from this spectral information—depict a spectrum and the acquired measurement signal in order to in turn assess the quality of the CSI measurement starting from this.

The spectral map 24 (see FIG. 5) is generated and shown in Step S17. In the following Step 18 it is checked whether the CSI measurement has been terminated, thus whether the raw data space has been completely acquired sufficiently often. If this is the case, the method ends. If this is not the case, the method returns to Step S11.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance spectroscopy, comprising the steps of:
   operating a magnetic resonance apparatus to implement a chemical shift imaging (CSI) pulse sequence for acquisition of magnetic resonance spectroscopic data from a subject situated in the magnetic resonance apparatus including, in said CSI pulse sequence, activating a phase coding gradient that spatially encodes spectral information detected with said pulse sequence, said phase coding gradient exhibiting at least one first time duration in which said phase coding gradient has a value of 0, and at least one second time duration in which said phase coding gradient has a non-zero value;
   during said CSI pulse sequence, acquiring magnetic resonance raw data representing spectral information, during each of said at least one first time duration and said at least one second time duration, and entering said raw data into an electronic memory representing raw data space, and repeating said CSI pulse sequence in a plurality of repetitions in order to execute a total number of said repetitions that fill an entirety of said raw data space with said raw data; and
   in a processor, converting only raw data in said raw data space that were acquired during said at least one first time duration when said phase coding gradient has a value of 0 into non-phase-coded spectral information, and making said non-phase-coded spectral information available from said processor in a form allowing a property of the non-phase-encoded spectral information to be evaluated before completing said total number of repetitions of said CSI pulse sequence.

2. A method as claimed in claim 1 comprising, from said processor, visually presenting said non-phase-encoded spectral information in said form allowing evaluation of said property, as a spectrum or a time signal.

3. A method as claimed in claim 1 comprising generating said non-phase-encoded spectral information in said form as a spectrum, and evaluating said property from said spectrum as at least one of a line width of spectral lines in the spectrum, a signal-to-noise ratio of spectral lines in the spectrum, and a presence of an unwanted spectral line in the spectrum.

4. A method as claimed in claim 1 wherein the plurality of repetitions of said CSI pulse sequence includes an initial implementation of said CSI pulse sequence, and comprising, before said initial implementation of said CSI pulse sequence;
   operating said magnetic resonance apparatus to implement said CSI pulse sequence with no activation of said phase coding gradient and acquiring raw data representing spectral information during said CSI pulse sequence with no activation of said phase coding gradient;
   in said processor, determining said property of said spectral information from said raw data acquired during said CSI pulse sequence with no activation of said phase coding gradient, as a reference property; and
   from said processor, also making said reference property available in a form allowing comparison of said property of the non-phase-coded spectral information with said reference property.

5. A method as claimed in claim 1 comprising, in said processor, converting said only raw data in said raw data space that were acquired during said at least one first time duration into said non-phase-coded spectral information as soon as said raw data are acquired during said at least one first time duration.

6. A method as claimed in claim 1 wherein said total number of repetitions of said CSI pulse sequence comprise a scan of the subject, and operating said magnetic resonance apparatus to implement said scan of said subject in multiple repetitions and, in each repetition of said scan, determining said non-phase-coded spectral information.

7. A method as claimed in claim 6 comprising, in an initial repetition of said CSI sequence in each scan, operating said magnetic resonance apparatus to selectively excite nuclear spins of the subject only in a limited volume of the subject, and acquiring said raw data only from said limited volume.

8. A method as claimed in claim 6 wherein said raw data space comprises a plurality of voxels and, in each repetition of said scan, selecting multiple voxels in said raw data space, and converting said only raw data acquired during said first time duration into said non-phase-coded spectral information only for said selected multiple voxels.

9. A magnetic resonance system for magnetic resonance spectroscopy, comprising:
   a magnetic resonance data acquisition unit;
   an electronic memory organized to represent raw data space;
   a control unit configured to operate said magnetic resonance data acquisition unit to implement a chemical shift imaging (CSI) pulse sequence for acquisition of magnetic resonance spectroscopic data from a subject situated in the data acquisition unit by, in said CSI pulse sequence, activating a phase coding gradient that spatially encodes spectral information detected with said pulse sequence, said phase coding gradient exhibiting at least one first time duration in which said phase coding gradient has a value of 0, and at least one second time duration in which said phase coding gradient has a non-zero value;

said control unit being configured to operate said data acquisition unit to acquire, during said CSI pulse sequence, magnetic resonance raw data representing spectral information, during each of said at least one first time duration and said at least one second time duration, and to enter said raw data into said electronic memory representing raw data space, and to repeat said CSI pulse sequence in a plurality of repetitions in order to execute a total number of said repetitions that fill an entirety of said raw data space with said raw data; and a processor configured to convert only raw data in said raw data space that were acquired during said at least one first time duration when said phase coding gradient has a value of 0 into non-phase-coded spectral information, and to make said non-phase-coded spectral information available from said processor in a form allowing a property of the spectral information to be evaluated before completing said total number of repetitions of said CSI pulse sequence.

10. A non-transitory computer-readable storage medium encoded with programming instructions, said storage medium being loaded into a computerized control and processing system of a magnetic resonance system, which includes a data acquisition unit, said programming instructions causing said computerized control and evaluation system to:

operate said data acquisition unit to implement a chemical shift imaging (CSI) pulse sequence for acquisition of magnetic resonance spectroscopic data from a subject situated in the data acquisition unit including, in said CSI pulse sequence, activating a phase coding gradient that spatially encodes spectral information detected with said pulse sequence, said phase coding gradient exhibiting at least one first time duration in which said phase coding gradient has a value of 0, and at least one second time duration in which said phase coding gradient has a non-zero value;

operate said data acquisition unit to acquire, during said CSI pulse sequence, magnetic resonance raw data, representing spectral information, during each of said at least one first time duration and said at least one second time duration, and entering said raw data into an electronic memory representing raw data space, and repeat said CSI pulse sequence in a plurality of repetitions in order to execute a total number of said repetitions that fill an entirety of said raw data space with said raw data; and convert only raw data in said raw data space that were acquired during said at least one first time duration when said phase coding gradient has a value of 0 into non-phase-coded spectral information, and make said non-phase-coded spectral information available from said processor in a form allowing a property of the non-phase-coded spectral information to be evaluated before completing said total number of repetitions of said CSI pulse sequence.

* * * * *